United States Patent
Butenhoff et al.

(10) Patent No.: US 10,979,045 B2
(45) Date of Patent: Apr. 13, 2021

(54) TRANSISTOR RINGING ADJUSTMENT CIRCUIT AND METHOD

(71) Applicant: TEXAS INSTRUMENTS INCORPORATED, Dallas, TX (US)

(72) Inventors: Michael Edwin Butenhoff, Minnesota City, MN (US); Rakesh Raja, Allen, TX (US); Anuj Jain, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/205,576

(22) Filed: Nov. 30, 2018

(65) Prior Publication Data

US 2020/0177179 A1 Jun. 4, 2020

(51) Int. Cl.
*H03K 17/687* (2006.01)

(52) U.S. Cl.
CPC .................. *H03K 17/6871* (2013.01)

(58) Field of Classification Search
CPC ............. H03K 17/00; H03K 17/04126; H03K 17/063; H03K 17/0826; H03K 17/601; H03K 17/6871; H03K 2217/00; H03K 2217/0036

USPC ........................................................ 327/109
See application file for complete search history.

(56) References Cited

U.S. PATENT DOCUMENTS

2019/0074827 A1* 3/2019 Norling ............ H01L 21/02472

* cited by examiner

*Primary Examiner* — Lincoln D Donovan
*Assistant Examiner* — Dave Mattison
(74) *Attorney, Agent, or Firm* — John R. Pessetto; Charles A. Brill; Frank D. Cimino

(57) ABSTRACT

A transistor, e.g., field effect transistor FET, ringing adjustment circuit and method comprising the measuring of a voltage from a transistor (e.g., a node of a FET) during the transistor turning on and turning off, determining the voltage oscillation in the measured voltage by performing a derivative function on the measured voltage and detecting a switch in a voltage change rate from positive to negative or negative to positive, and comparing the voltage change rate after the detected switch to adjust drive current applied to the transistor to optimize efficiency while minimizing voltage oscillation and ringing.

23 Claims, 4 Drawing Sheets

TRANSISTOR RINGING ADJUSTMENT CIRCUIT AND METHOD

BACKGROUND

A transistor, such as a field effect transistor (FET), is turned on or off after a drive current is applied. The drive current may be applied to a gate of a FET to turn on the FET. Sudden application of the drive current creates a voltage oscillation that may lead to unwanted electromagnetic (EM) emission. The size of the drive current is positively correlated with the frequency of the voltage oscillation. Accordingly, the higher the drive current applied to the FET, the higher the probability of a high frequency voltage oscillation and unintended EM emission.

The size of the drive current, however, is also positively correlated with the speed of the FET. In other words, the higher the drive current, the faster the FET can be turned on and off. In order to balance operational efficiency and speed with unwanted ringing caused by a voltage oscillation, the drive current may be manually tuned to achieve an optimal efficiency while maintaining EM emission within an acceptable range. For instance, the drive current may be manually tuned to find an optimum gate current for a FET to power on and off a motor.

A change in a system or parts used with the FET, or temperature, however, changes the parasitic inductance or capacitance of the overall system that affects the voltage oscillation. This, in turn, warps the balance achieved by the manual tuning of a drive current to the FET.

SUMMARY

An aspect of the present invention provides a transistor ringing adjustment circuit comprising, a sensor configured to sense a voltage from a transistor, a derivative detector configured to detect a change in voltage sense by the sensor, a gate drive configured to provide drive current to the transistor, and an adaptive gate control configured to adjust the drive current provided by the gate drive, wherein the derivative detector is configured to determine a rate of change of voltage sensed by the sensor and detect a switch in the voltage change rate from positive to negative or from negative to positive, and the adaptive gate control is configured to adjust the drive current based on the voltage change rate and the switch.

An aspect of the present invention also provides a transistor ringing adjustment circuit comprising, a sensor configured to sense a voltage from a transistor, a derivative detector configured to determine a rate of change of voltage sensed by the sensor, a peak detector configured to detect a peak of the voltage change rate, a gate drive configured to provide drive current to the transistor, and an adaptive gate control configured to adjust the drive current provided by the gate drive based on the peak detected by the peak detector.

An aspect of the present invention further provides a transistor ringing adjustment method comprising, sensing a voltage from at least one node of a transistor, determining a rate of change of the voltage sensed, detecting a peak of the voltage change rate, comparing the peak with a threshold, and adjusting a drive current provided to the transistor based on a difference between the peak and the threshold.

BRIEF DESCRIPTION OF THE DRAWINGS

For a detailed description of various examples, reference will now be made to the accompanying drawings in which.

DETAILED DESCRIPTION

In the following detailed description, reference is made to certain examples of the present invention. These examples are described with sufficient detail to enable those skilled in the art to practice them. It is to be understood that other examples may be employed and that various structural, logical, and electrical changes may be made. Moreover, while specific examples are described in connection with a Field Effect Transistor (FET), it should be understood that features described herein are generally applicable to other types of electronic parts, circuits, or transistors. In other words, the embodiments of the present invention should be interpreted to cover and read on other types of electronic parts, circuits, and transistors.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Figure 1:
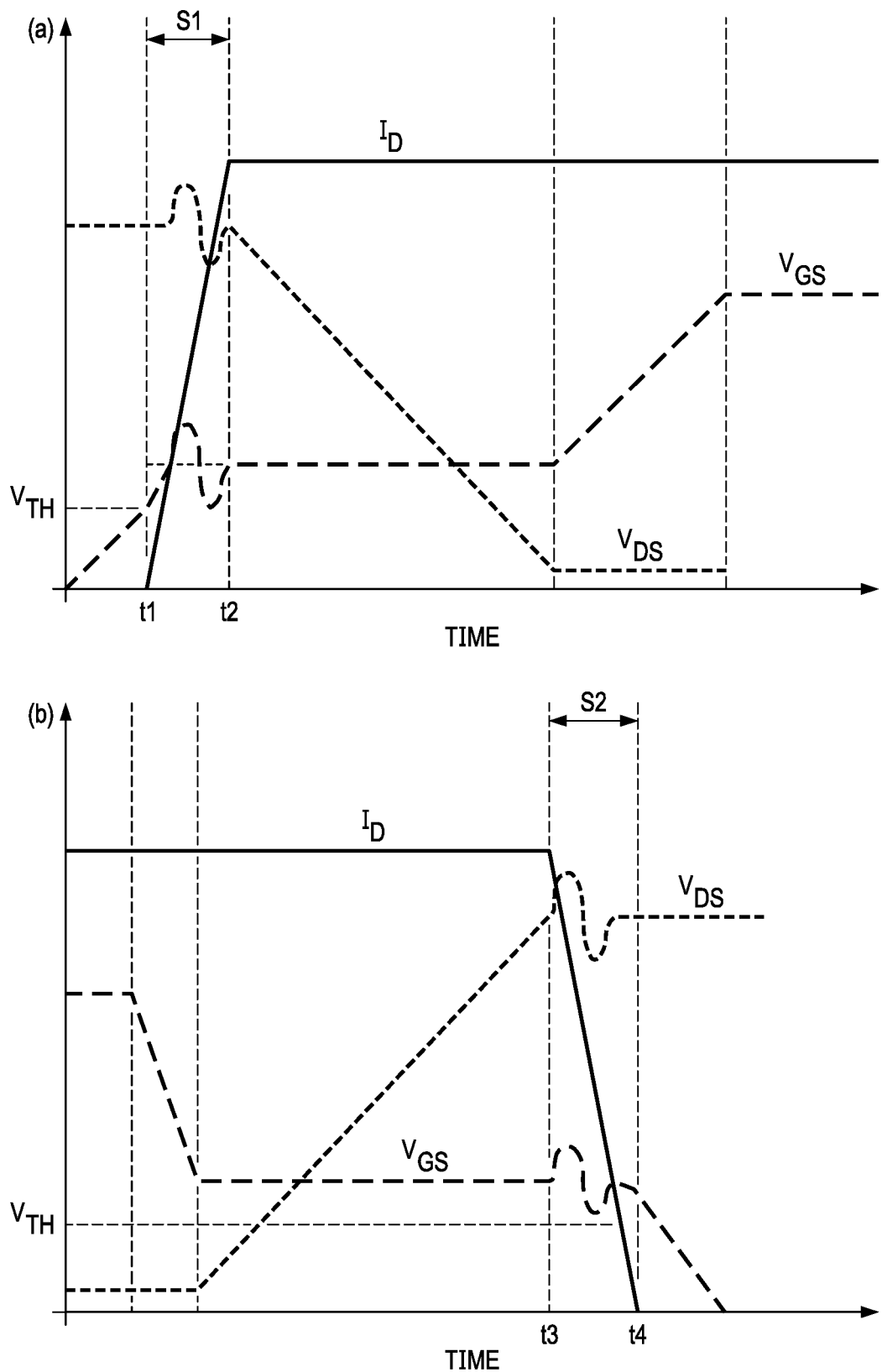
FIG. 1 illustrates graphs of current and voltage of a FET when the FET is turned on and turned off.

FIG. 1 illustrates graphs of current and voltage of a FET when the FET is turned on and turned off. In particular, graph (a) of FIG. 1 illustrates drain current $I_D$ of a NMOS FET over time when a drive current is applied to a gate of the NMOS FET and the NMOS FET is turned on. Graph (a) of FIG. 1 further illustrates gate source voltage $V_{GS}$ and drain source voltage $V_{DS}$ of the NMOS FET during the turn on of the NMOS FET. In particular, drain current $I_D$ of the NMOS FET increases with the application of a drive current, as seen in during the time period S1 between time t1 and t2, until it reaches a plateau. Also during the turn on of the NMOS FET, gate source voltage $V_{GS}$ exceeds threshold voltage $V_{TH}$ and increases until it reaches a plateau, while drain source voltage $V_{DS}$ decreases over time to reach a plateau. Ringing in gate source voltage $V_{GS}$ and drain source voltage $V_{DS}$ can be observed during time period S1 during the turn on.

Conversely, graph (b) illustrates drain current $I_D$ of a NMOS FET over time when a drive current to a gate of the NMOS FET is cut off to turn off the NMOS FET. Graph (b) of FIG. 1 further illustrates gate source voltage $V_{GS}$ and drain source voltage $V_{DS}$ of the NMOS FET during the turn off. In particular, drain current $I_D$ of the NMOS FET decreases with the cut off of a drive current, as seen during the time period S2 between time t3 and t4. Also during the turn off of the NMOS FET, gate source voltage $V_{GS}$ decreases to fall below threshold voltage $V_{TH}$ while drain source voltage $V_{DS}$ increases over time to reach a plateau. Ringing in gate source voltage $V_{GS}$ and drain source voltage $V_{DS}$ can be observed during time period S2 during the turn off.

If drive current is too high, the NMOS FET will turn on and turn off faster, and the NMOS FET operation will be more efficient. But too high drive current results in more ringing within the time periods S1, S2. Less drive current, on the other hand, results in slower NMOS FET turn on and turn off, but ringing caused by voltage oscillation within time periods S1, S2 is reduced.

It is time consuming to manually tune drive current to maximize efficiency while maintaining ringing within an acceptable range. Also, the voltage oscillation occurring during a FET turn on and turn off is impacted by parasitic inductance and/or capacitance, which exists in silicon bond wire, circuit packages and pins, circuit board trace, etc. Accordingly, even if drive current were optimized to maximize efficiency while suppressing voltage oscillation for a certain setting, such drive current is not an optimum drive current for the same FET in a different setting (e.g., a different load, such as a different type or size of motor, is connected to the FET system, temperature change, etc.). According to an aspect of the present invention, drive current is automatically optimized for a given system by detecting voltage change rate and a switch in the voltage change range from positive to negative or from negative to positive.

Figure 2:
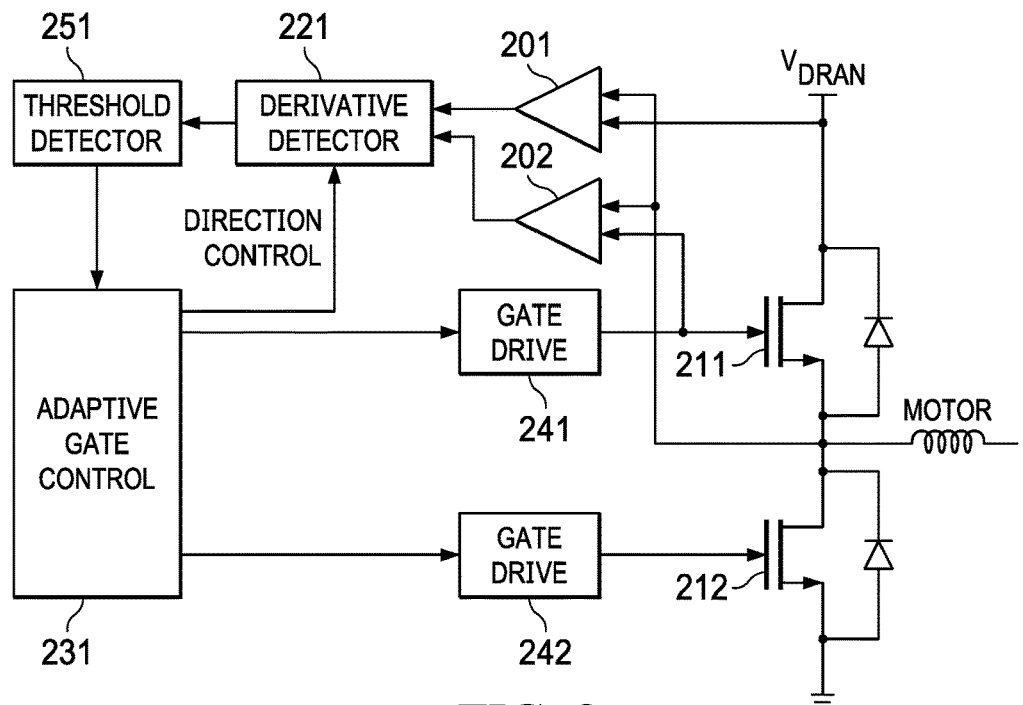
FIG. 2 illustrates a FET ringing adjustment circuit according to an example of the present invention.

FIG. 2 illustrates a FET ringing adjustment circuit according to an example of the present invention. The FET ringing adjustment circuit of FIG. 2 comprises buffer 201, 202 configured to store a voltage sensed from different nodes of NMOS FET 211, derivative detector 221 configured to detect a change in voltage value stored in buffer 201, 202, gate drive 241 configured to provide drive current to NMOS FET 211, and adaptive gate control 231 configured to adjust the drive current provided by gate drive 241.

In the example of FIG. 2, derivative detector 221 is further configured to determine a rate of change of voltage value stored in buffer 201, 202 and detect a switch in the voltage change rate from positive to negative or from negative to positive. Adaptive gate control 231 is further configured to adjust the drive current provided by the gate drive 241 based on the voltage change rate and the switch.

Adaptive gate control 231 may further comprise threshold detector 251 configured to compare the voltage change rate determined by derivative detector 221 with a threshold value. Adaptive gate control 231 is configured to adjust the drive current provided by gate drive 241 based on a difference between the detected voltage change rate and the threshold value after the switch is detected by derivative detector 221. The threshold value may be adjusted depending on the desired efficiency and acceptable range of ringing of a FET.

For instance, adaptive gate control 231 is configured to decrease the drive current provided by gate drive 241 when an absolute value of the voltage change rate determined by derivative detector 221 is above the threshold value. Adaptive gate control 231 is also configured to increase the drive current provided by gate drive 241 when an absolute value of the voltage change rate determined by derivative detector 221 is below the threshold value.

Derivative detector 221 may be further configured to detect either the switch in the voltage change rate from positive to negative, or the switch in the voltage change rate from negative to positive, based on a control signal provided by adaptive gate control 231. Adaptive gate control 231 is configured to provide the control signal, based on which voltage is measured from NMOS FET 211 and during which operation, to the derivative detector 221.

For instance, when a FET is turned on, its gate source voltage is set to increase while its drain source voltage is set to decrease. See graph (a) of FIG. 1. When a ringing occurs (see time period S1 of graph (a)), the gate source voltage and drain source voltage oscillates. Accordingly, when there is a ringing, a decrease is temporarily observed in the gate source voltage before the gate source voltage reaches a plateau, during the turning on of a FET. Similarly, when there is a ringing, an increase is temporarily observed in the drain source voltage during the turning on of a FET before the drain source voltage reaches a plateau.

Adaptive gate control 231 is configured to provide control signal to derivate detector 221 indicating the desired direction of a voltage change rate (e.g., positive, negative), and derivative detector 221 is configured to determine a switch in the voltage change rate in the opposite direction. For instance, adaptive gate control 231 is configured to provide control signal to derivative detector 221 signaling that the desired direction of a voltage change rate of the gate source voltage measured, from a FET being turned on, is positive. Derivative detector 221 is configured to detect switch in the opposite direction (e.g., switch in the voltage change rate from positive to negative).

Figure 3:
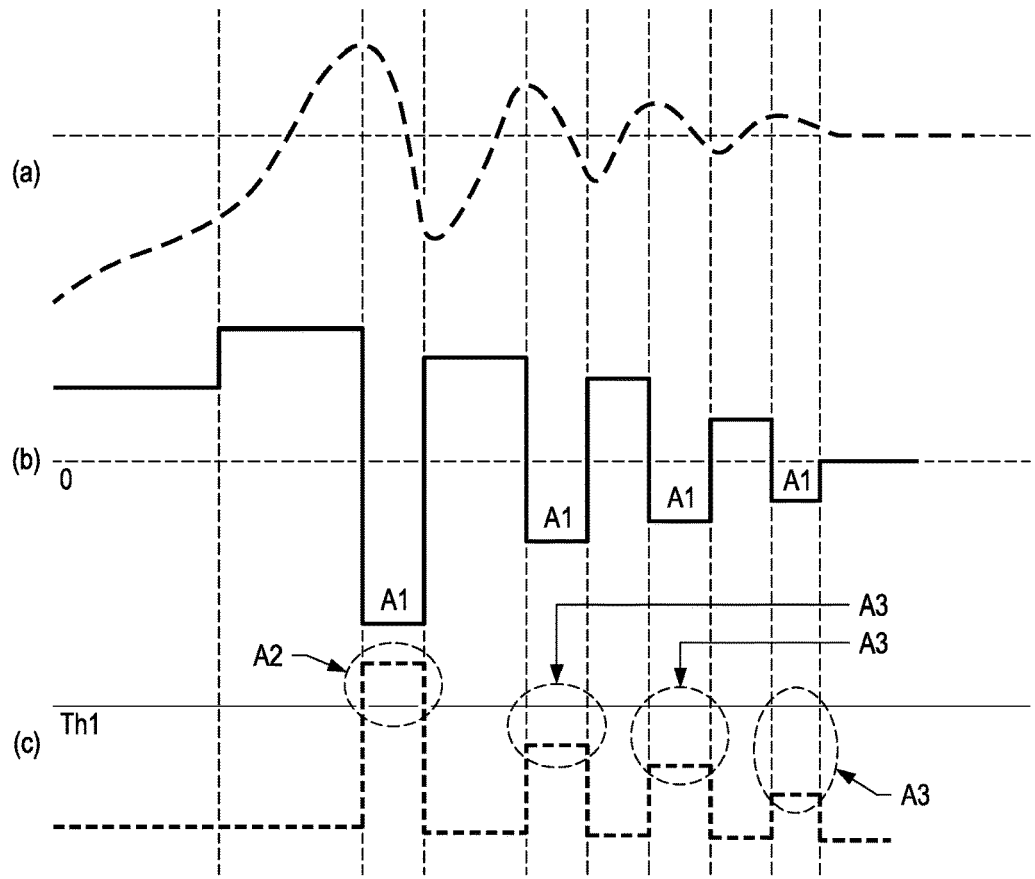
FIG. 3 illustrates the timing diagram of voltage and signal outputs of the FET ringing adjustment circuit of FIG. 2.

FIG. 3 illustrates the timing diagram of voltage and signal outputs of the FET ringing adjustment circuit of FIG. 2. On top of FIG. 3, timing diagram (a) illustrates gate source voltage $V_{GS}$ of NMOS FET 211 during the period when NMOS FET 211 is turned on. While no voltage oscillation is desired during the turning on period, in reality, $V_{GS}$ oscillates before it reaches a plateau.

Derivative detector 221 determines the voltage change rate of the $V_{GS}$, which is shown in the middle timing diagram (b) of FIG. 3. As shown, where the $V_{GS}$ in increasing, the voltage change rate is positive, and where the $V_{GS}$ is decreasing, the voltage change rate is negative (A1). Derivative detector 221 output is a result of performing a derivative on $V_{GS}$. In FIG. 3, derivative detector 221 yields voltage change rate by performing derivative on $V_{GS}$.

During the turning on of NMOS FET 211, an increase is expected in $V_{GS}$ of NMOS FET 211 until it reaches a plateau. Accordingly, adaptive gate control 231 is configured to provide a direction control signal to derivative detector 221 to detect a switch in the voltage change rate from positive to negative to detect a voltage oscillation.

When the derivative detector 221 detects a switch in the voltage change rate from positive to negative, adaptive gate control 231 compares the absolute value of the negative voltage change rate with threshold Th1, as shown in the bottom timing diagram (c) of FIG. 3. When the absolute value of the negative voltage change rate is above threshold Th1 (A2), the ringing caused by voltage oscillation is above an acceptable value and adaptive gate control 231 decreases the drive current from gate drive 241 to NMOS FET 211. Conversely, when the absolute value of the negative voltage change rate is below threshold Th 1 (A3), the ringing caused by voltage oscillation is below an acceptable value and adaptive gate control 231 increase the drive current from gate drive 241 to NMOS FET 211.

In FIG. 2, buffer 201, 202 are configured to store voltages sensed from gate, drain, and source of NMOS FET 211. Buffer 201 is configured to store the drain source voltage $V_{DS}$ of NMOS FET 211. Buffer 202 is configured to store the gate source voltage $V_{GS}$ of NMOS FET 211. The number of buffers adopted by the FET ring adjustment circuit, and the placement of these buffers, may be adjusted to measure voltage from more or less nodes of more or less FETs present in a given circuit.

For instance, the FET ringing adjustment circuit according to an aspect of the present invention may adopt only one buffer to measure the gate source voltage of one FET, but not the drain source voltage. In another instance, the FET ringing adjustment circuit according to an aspect of the present invention may adopt two more buffers, in addition to buffers 201, 202, to measure the gate source voltage and drain source voltage of a second FET (e.g., NMOS FET 212). The number of buffers employed, and the nodes from which the stored voltage value is measured, may further be adjusted based on the number of FETs adopted within a given circuit and the placement of these FETs.

Further, in the example of FIG. 2, buffers 201, 202 are used to temporarily store the measured gate source voltage and drain source voltage of NMOS FET 211. Buffers 201, 202, however, may be omitted and derivative detector 211 may rely on internal buffers to determine the change in voltage measured by sensors sensing voltage from at least one node of a FET.

In the example of FIG. 2, adaptive gate control adjusts the drive current provided by gate drive 241 to NMOS FET 211. When additional buffers are employed to measure gate source voltage or drain source voltage of NMOS FET 212, adaptive gate control 231 may also adjust the drive current provided by gate drive 242 to NMOS FET 212 to minimize oscillation while maximizing efficiency.

Figure 4:
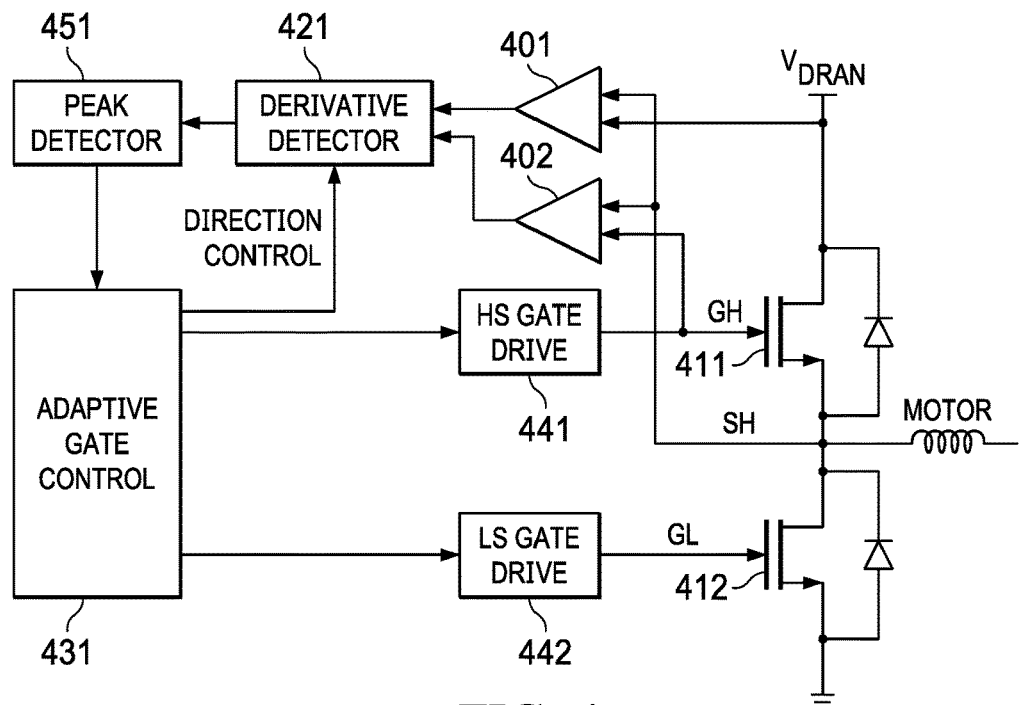
FIG. 4 illustrates a FET ringing adjustment circuit according to another example of the present invention.

FIG. 4 illustrates a FET ringing adjustment circuit according to another example of the present invention. The FET ringing adjustment circuit of FIG. 4 comprises buffers 401, 402 configured to store voltage value measured from gate, drain and source of NMOS FET 411, derivative detector 421 configured to perform a derivative function on the voltage value stored in buffers 401, 402 to determine a voltage change rate, peak detector 451 configured to detect a peak of the voltage change rate, gate drive 441 configured to provide drive current to NMOS FET 411, and adaptive gate control 431 configured to adjust the drive current from the gate drive 441 based on the peak detected by peak detector 451.

Adaptive gate control 431 is configured to adjust the drive current from the gate drive 441 based on the peak and a threshold. When the peak is above the threshold value, adaptive gate control 431 is configured to decrease the drive current from gate drive 441. When the peak is below the threshold, adaptive gate control 431 is configured to increase the drive current from gate drive 441.

Derivative detector 421 is further configured to detect a switch in the voltage change rate from positive to negative or from negative to positive. Peak detector 451 is configured to detect the peak after the switch is detected by derivative detector. Depending on from which a voltage is measured and whether a FET is turned on or off, adaptive gate control 431 provides a control signal to derivative detector 421 to determine whether the voltage change rate is switched from positive to negative or from negative to positive.

For instance, where derivative detector 421 determines voltage change rate of the gate source voltage value of NMOS FET 411 stored in buffer 422, while the NMOS FET 411 is being turned on, adaptive gate control 431 provides a control signal to derivative detector 421 to detect a switch from positive to negative. This is because, while NMOS FET being turned on, it is desired that its gain source voltage increases until it reaches a plateau. Any oscillation of the measured gain source voltage would result in a negative voltage change rate. Accordingly, derivative detector 421 is configured to detect the switch in voltage change rate from positive to negative.

Figure 5:
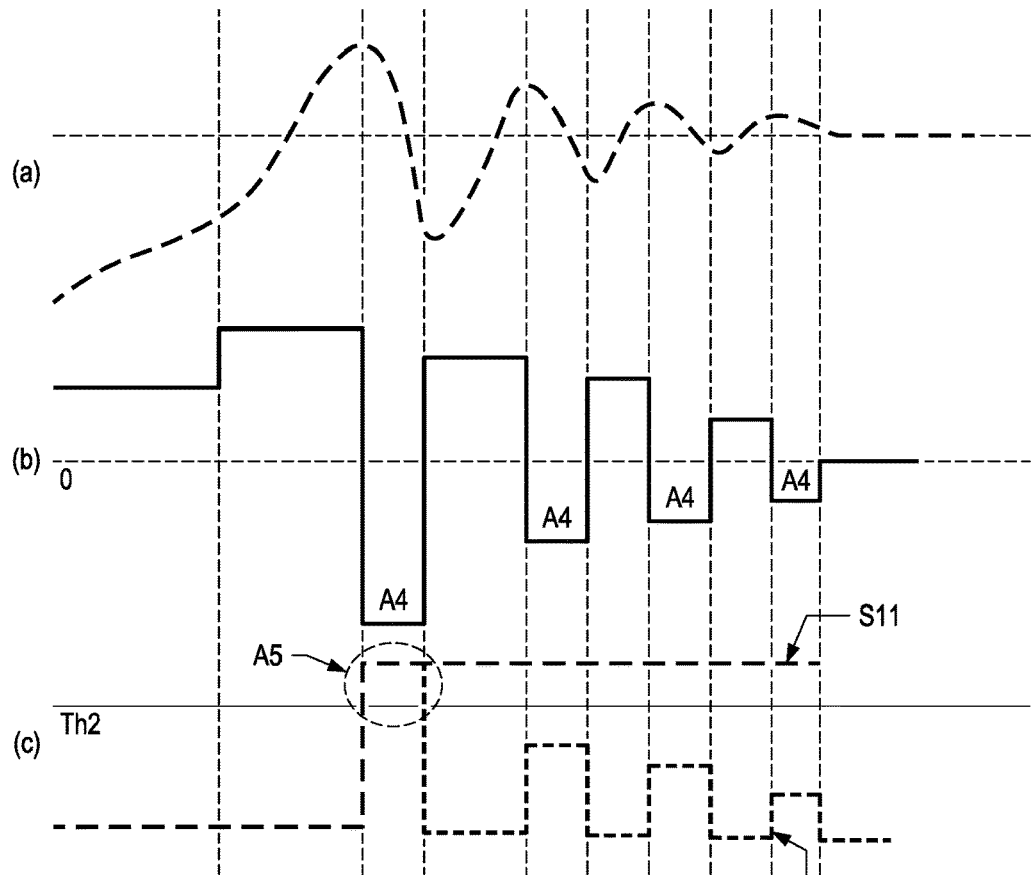
FIG. 5 illustrates the timing diagram of voltage and signal outputs of the FET ringing adjustment circuit of FIG. 4.

FIG. 5 illustrates the timing diagram of voltage and signal outputs of the FET ringing adjustment circuit of FIG. 4. The first timing diagram (a) of FIG. 5 illustrates the gate source voltage $V_{GS}$ of NMOS FET 411 while drive current is applied to a gate of NMOS FET 411 by gate drive 441. In timing diagram (a) shown on FIG. 5, NMOS FET 411 is turned on. While no voltage oscillation is desired during the turning on period, in reality, $V_{GS}$ oscillates before it reaches a plateau.

Derivative detector 421 determines the voltage change rate of the $V_{GS}$, which is shown in the middle timing diagram (b) of FIG. 5. As shown, where the $V_{GS}$ in increasing, the voltage change rate is positive, and where the $V_{GS}$ is decreasing, the voltage change rate is negative (A4). In FIG. 5, derivative detector 421 yields voltage change rate by performing derivative on $V_{GS}$.

Because an increase in $V_{GS}$ of NMOS FET 411 is expected until it reaches a plateau, adaptive gate control 431 is configured to provide a direction control signal to derivative detector 421 to detect a switch in the voltage change rate from positive to negative to detect a voltage oscillation. When the derivative detector 421 detects a switch in the voltage change rate from positive to negative, peak detector 451 detects a peak from the voltage change rate output of derivative detector 421.

As seen in the final timing diagram (c) of FIG. 5, peak detector 451 detects a peak of a negative voltage change rate. S11 illustrates the output of peak detector 451. Because peak detector 451 detects a peak of voltage change rate after there is a switch in voltage change rate from positive to negative, the peak detected by peak detector 451 is the same as a peak detected from an absolute value of negative voltage change rate from derivative detector 431. S12 illustrates the absolute value of negative voltage change rate from derivative detector 431.

When the detected peak is above a threshold, threshold Th2, adaptive gate control 431 adjust the drive current from gate drive 441 to NMOS FET 411. As shown in timing diagram (c) of FIG. 5, when the detected peak is above threshold Th2 (A5), adaptive gate control 431 decreases the drive current from gate drive 441 to NMOS FET 411. This will cause the NMOS FET 411 to turn on slower, but also lower the detected peaks because voltage oscillation will also be reduced. Conversely, when the detected peak is below threshold Th2, adaptive gate 432 increases the drive current from gate drive 441 to NMOS FET 411. The increase of drive current causes the NMOS FET 411 to turn on faster, which in turn increases the detected peak because voltage oscillation will also increase with the faster FET turn on.

As with the example of FIG. 2, additional buffers may be employed to measure gate source voltage or drain source voltage of NMOS FET 412. In such case, adaptive gate control 431 may also adjust the drive current provided by gate drive 442 to NMOS FET 412 to minimize oscillation while maximizing efficiency. The FET ringing adjustment circuit of FIG. 4 may also be reconfigured to sense only the gate source voltage of NMOS FET 411. In such case, only one buffer 402 is required.

Buffers 401, 402 of FIG. 4 are configured to temporarily store voltages sensed from gate, drain, and source of NMOS FET 411. Buffers 401, 402, however, may be omitted and derivative detector 411 may rely on internal buffers to determine the change in voltage measured by sensors sensing voltage from at least one node of a FET.

In the embodiments of FIGS. 2-5, threshold Th1 and Th2 may comprise a threshold band with a range. When threshold Th1 comprises a threshold band, adaptive gate control 231 compares whether an absolute value of the negative voltage change rate is within the range of the threshold band. If the absolute value is within the range of the threshold band, adaptive gate control 231 does not adjust the drive current from gate drive 241 to NMOS FET 211. If the absolute value is above the upper limit of the threshold band, however, adaptive gate control 231 decreases the drive current from gate drive 241 to NMOS FET 211, until the absolute value is within the range of the threshold band. If the absolute value is below the lower limit of the threshold band, on the other hand, adaptive gate control 231 increases the drive current from gate drive 241 to NMOS FET 211, until the absolute value is within the range of the threshold band.

Similarly, when threshold Th2 of FIG. 5 comprises a threshold band, adaptive gate control 431 compares whether a detected peak is within the range of the threshold band. If the detected peak is within the range of the threshold band, adaptive gate control 431 does not adjust the drive current from gate drive 441 to NMOS FET 411. If the detected peak is above the upper limit of the threshold band, however, adaptive gate control 431 decreases the drive current from gate drive 441 to NMOS FET 411, until the detected peak is within the range of the threshold band. If the absolute value is below the lower limit of the threshold band, on the other hand, adaptive gate control 431 increases the drive current from gate drive 441 to NMOS FET 411, until the detected peak is within the range of the threshold band.

Figure 6:
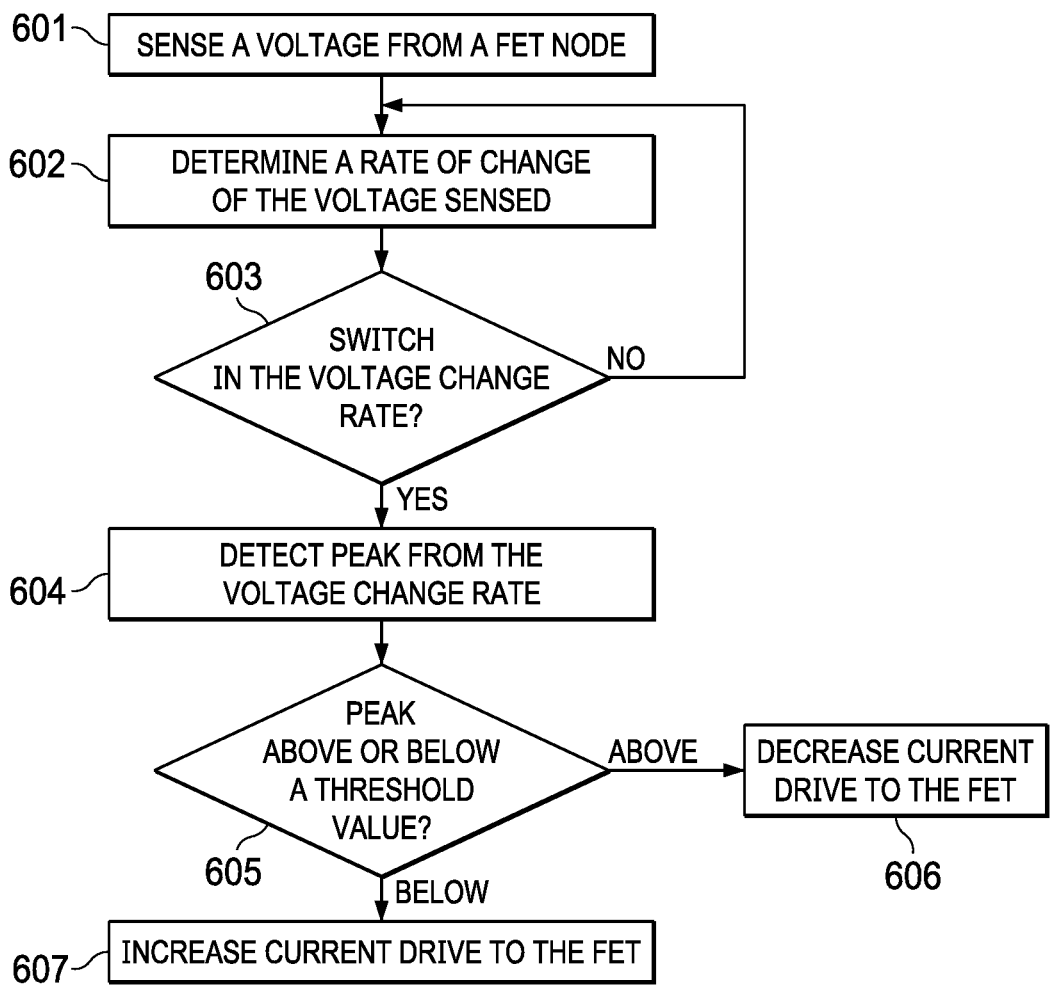
FIG. 6 illustrates a flow chart of a FET ringing adjustment method according to an example of the present invention.

FIG. 6 illustrates a flow chart of a FET ringing adjustment method according to an example of the present invention. In step 601, a voltage from a FET node is sensed. In step 602, the rate of change of the voltage sensed is determined by performing a derivative function on the voltage sensed. In step 603, whether there is a switch in the voltage change rate from positive to negative or negative to positive is detected.

Whether in step 603 a switch from positive to negative is detected or a switch from negative to positive is detected is based on a locality of point from which voltage is measured in step 601. It is also based on whether the FET, from which a voltage is measured, is being turned on or turned off. For instance, in examples of FIGS. 2-5, gate source voltage is measured while NMOS FET is being turned on. In such case a switch from positive to negative is detected.

When there is a switch from positive to negative, peak from the voltage change rate is detected in step 604. The peak is compared with a threshold value in step 605. When the peak is above the threshold value, the drive current applied to the FET is decreased in step 606 to slow down the turn on speed while reducing the voltage oscillation. When the peak is below the threshold value, the drive current applied to the FET is increased in step 607 to speed up the turn on speed even if it increases voltage oscillation.

While it is not illustrated in FIG. 6, or discussed in connection with FIG. 6, it should be noted that a transistor ringing adjustment method, according to an aspect of the present invention, includes a method where an absolute value of the detected voltage change rate is compared with the threshold value, as described in the examples of FIGS. 2 and 3.

Also, a transistor ringing adjustment method, according to an aspect of the present invention, includes a method where a peak or an absolute value of the detected voltage change rate is compared with a threshold band. Where the peak or the absolute value is compared with the threshold band, the respective method does not adjust a drive current to a transistor as long as the peak or the absolute value is within the range of the band. When the peak or the absolute value is above the upper limit of the band, however, the drive current is adjusted to decrease the current applied to a gate of the transistor, until the peak or the absolute value is within the range of the band. Coversely, when the peak or the absolute value is below the lower limit of the band, the drive current is adjusted to increase the current applied to a gate of the transistor, until the peak or the absolute value is within the range of the band.

The threshold value of FIG. 6 that is compared with the detected peak is programmable. Accordingly, users of a FET or the FET ringing adjustment system may set a threshold value or threshold band that yields efficiency and EM emission within an acceptable range. Because the voltage oscillation occurring during the FET turn on and off may be set to be consistently monitored, the size of the voltage oscillation is consistently compared with the threshold value or the threshold band, and drive current to the FET can be adjusted based on the comparison. Accordingly, an exemplary FET ringing adjustment circuit and method eliminates the manual tuning process whenever there is a new setting.

The above description and drawings are only to be considered illustrative of an example of the present invention which achieves the features and advantages described herein. Modifications are possible in the described examples, and other examples are possible, within the scope of the claims. Accordingly, the examples of the present invention described herein are not considered as being limited by the foregoing description and drawings.

What is claimed is:

1. A transistor ringing adjustment circuit comprising:
a transistor;
a sensor coupled to the transistor;
a derivative detector coupled to the sensor, wherein the derivative detector is configured to:
 determine a voltage change rate of a voltage sensed by the sensor; and
 detect a change in the voltage change rate; and
a control coupled between the derivative detector and the transistor, wherein the control is configured to:
 provide a control signal to the derivative detector, the control signal to the derivative detector determining whether to detect the change in the voltage change rate from positive to negative or the change in the voltage change rate from negative to positive; and
 adjust a drive current of the transistor based on the voltage change rate and the detected switch.

2. The transistor ringing adjustment circuit of claim 1, wherein the control includes a threshold detector configured to compare the voltage change rate with a threshold value, and wherein the control is configured to adjust the drive current based on a difference between the voltage change rate and the threshold value after the switch is detected by the derivative detector.

3. The transistor ringing adjustment circuit of claim 2, wherein the control is configured to decrease the drive current when an absolute value of the voltage change rate is above the threshold value.

4. The transistor ringing adjustment circuit of claim 2, wherein the control is configured to increase the drive current when an absolute value the voltage change rate is below the threshold value.

5. The transistor ringing adjustment circuit of claim 1, wherein the control includes a threshold detector configured to compare the voltage change rate with a threshold band, and wherein the control is configured to adjust the drive current so that the voltage change rate is within the threshold band.

6. The transistor ringing adjustment circuit of claim 1, wherein the derivative detector is configured to detect either the change in the voltage change rate from positive to negative or the change in the voltage change rate from negative to positive based on the control signal provided by the control, and the control is configured to provide the control signal to the derivative detector further based on a locality of at least one node of the transistor from which the voltage is sensed by the sensor.

7. The transistor ringing adjustment circuit of claim 6, wherein the control is configured to provide the control signal to the derivative detector to detect the switch in the voltage change rate from positive to negative when:
the at least one node of the transistor is a gate of a NMOS field effect transistor; and
the NMOS field effect transistor is being turned on.

8. The transistor ringing adjustment circuit of claim 6, wherein the control is configured to provide the control signal to the derivative detector to detect the switch in the voltage change rate from negative to positive when:
the at least one node of the transistor is a gate of a NMOS field effect transistor; and
the NMOS field effect transistor is being turned off.

9. A transistor ringing adjustment circuit comprising:
a sensor coupled to a transistor;
a derivative detector coupled to the sensor, wherein the derivative detector is configured to determine a voltage change rate of a voltage sensed by the sensor;
a peak detector coupled to the derivative detector, wherein the peak detector is configured to detect a peak of the voltage change rate; and
an control coupled to the detector and the peak detector, wherein the control is configured to:
provide a control signal to the derivative detector, the control signal to the derivative detector determining whether to detect a first change in the voltage change rate from positive to negative or a second change in the voltage change rate from negative to positive; and
adjust a drive current provided by a gate drive based on the peak detected by the peak detector.

10. The transistor ringing adjustment circuit of claim 9, wherein the control is configured to adjust the drive current based on a difference between the peak and a threshold value.

11. The transistor ringing adjustment circuit of claim 10, wherein the control is configured to decrease the drive current when the peak is above the threshold value.

12. The transistor ringing adjustment circuit of claim 10, wherein the control is configured to increase the drive current when the peak is below the threshold value.

13. The transistor ringing adjustment circuit of claim 9, wherein the control is configured to adjust the drive current so that the peak is within a threshold band.

14. The transistor ringing adjustment circuit of claim 9, wherein the derivative detector is configured to detect the first change in the voltage change rate from positive to negative or the second change in the voltage change rate from negative to positive, and the peak detector is configured to detect the peak after the first or second switch is detected by the derivative detector.

15. The transistor ringing adjustment circuit of claim 14, wherein the derivative detector is configured to detect either the first change in the voltage change rate from positive to negative or the second change in the voltage change rate from negative to positive based on the control signal provided by the adaptive gate control, and the control is configured to provide the control signal to the derivative detector further based on a locality of at least one node of the transistor from which the voltage is sensed by the sensor.

16. The transistor ringing adjustment circuit of claim 15, wherein the control is configured to provide the control signal to the derivative detector to detect the first switch in the voltage change rate from positive to negative when:
the at least one node of the transistor is a gate of a NMOS field effect transistor; and
the NMOS field effect transistor is being turned on.

17. The transistor ringing adjustment circuit of claim 15, wherein the control is configured to provide the control signal to the derivative detector to detect the second switch in the voltage change rate from negative to positive when:
the at least one node of the transistor is a gate of a NMOS field effect transistor; and
the NMOS field effect transistor is being turned off.

18. A transistor ringing adjustment method comprising:
sensing a voltage from at least one node of a transistor;
providing, based on an operating mode of the transistor, a control signal indicating whether to detect a first change in a voltage change rate from positive to negative or a second change in the voltage change rate from negative to positive;
determining, in response to obtaining the control signal, the voltage change rate of the voltage sensed;
detecting a peak of the voltage change rate;
comparing the peak with a threshold; and
adjusting a drive current provided to the transistor based on a difference between the peak and the threshold.

19. The method of claim 18, wherein the adjusting includes decreasing the drive current when the peak is above the threshold.

20. The method of claim 18, wherein the adjusting includes increasing the drive current when the peak is below the threshold.

21. The method of claim 18, wherein the threshold includes a band, and wherein the drive current provided to the transistor is adjusted when the peak is above an upper limit of the band or the below a lower limit of the band until the peak is within the band.

22. The method of claim 18 further includes:
detecting the first change in the voltage change rate from positive to negative or the second change in the voltage change rate from negative to positive, and
wherein the peak is detected after the first or second change is detected.

23. The method of claim 21, wherein the detecting of the first switch in the voltage change rate includes detecting either the first change in the voltage change rate from positive to negative or the second change in the voltage change rate from negative to positive, further based on a locality of the at least one node of the transistor from which the voltage is sensed.

* * * * *